United States Patent
Kasuga et al.

(10) Patent No.: US 10,812,729 B2
(45) Date of Patent: Oct. 20, 2020

(54) SOLID-STATE IMAGING DEVICE

(71) Applicant: PANASONIC INTELLECTUAL PROPERTY MANAGEMENT CO., LTD., Osaka (JP)

(72) Inventors: Shigetaka Kasuga, Osaka (JP); Seiji Yamahira, Kyoto (JP); Yoshihisa Kato, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 881 days.

(21) Appl. No.: 15/461,159

(22) Filed: Mar. 16, 2017

(65) Prior Publication Data
US 2017/0187939 A1  Jun. 29, 2017

Related U.S. Application Data

(63) Continuation of application No. PCT/JP2015/004547, filed on Sep. 8, 2015.

(30) Foreign Application Priority Data

Sep. 19, 2014  (JP) ................................. 2014-191115

(51) Int. Cl.
*H04N 5/235* (2006.01)
*H04N 5/374* (2011.01)
(Continued)

(52) U.S. Cl.
CPC .............. *H04N 5/2351* (2013.01); *G01J 1/44* (2013.01); *H04N 5/374* (2013.01); *H04N 5/378* (2013.01);
(Continued)

(58) Field of Classification Search
CPC .... H04N 5/2351; H04N 5/378; H04N 5/3745; H04N 5/374; G01J 1/44; G01J 2001/4466; G01J 2001/442; H01L 31/107
See application file for complete search history.

(56) References Cited

U.S. PATENT DOCUMENTS

| 4,710,817 A | 12/1987 | Ando |
| 2006/0219866 A1 | 10/2006 | Egawa et al. |

(Continued)

FOREIGN PATENT DOCUMENTS

| CN | 1842138 A | 10/2006 |
| JP | 61-152176 A | 7/1986 |

(Continued)

OTHER PUBLICATIONS

Neale A.W. Dutton et al. "9.8 µm SPAD-based Analogue Single Photon Counting Pixel with Bias Controlled Sensitivity," International Image Sensor Workshop. 2013. available online: www.css.eng.ed.ac.uk.

(Continued)

*Primary Examiner* — Tony Ko
(74) *Attorney, Agent, or Firm* — McDermott Will & Emery LLP

(57) ABSTRACT

A solid-state imaging device includes a detector, a count value storage, and a reader. The detector includes an avalanche amplification type light receiving element that detects a photon, and a resetter that resets an output potential of the light receiving element, and outputs a digital signal that indicates the presence or absence of incidence of a photon on the light receiving element. The count value storage performs counting by converting the digital signal output from the detector to an analog voltage, and stores the result of counting as a count value. The reader outputs an analog signal indicating the count value.

15 Claims, 11 Drawing Sheets

(51) Int. Cl.
   *H04N 5/3745* (2011.01)
   *H04N 5/378* (2011.01)
   *G01J 1/44* (2006.01)
   *H01L 31/107* (2006.01)

(52) U.S. Cl.
   CPC ...... *H04N 5/3745* (2013.01); *G01J 2001/442* (2013.01); *G01J 2001/4466* (2013.01); *H01L 31/107* (2013.01)

(56) References Cited

U.S. PATENT DOCUMENTS

2014/0375855 A1  12/2014  Nishihara et al.
2016/0234450 A1   8/2016  Nishihara et al.
2017/0131143 A1*  5/2017  Andreou ............... G01J 1/44

FOREIGN PATENT DOCUMENTS

JP  07-067043 A  3/1995
WO  2013/099723 A1  7/2013

OTHER PUBLICATIONS

Pancheri, L., et al. "SPAD Image Sensor With Analog Counting Pixel for Time-Resolved Fluorescence Detection," IEEE Transactions on Electron Devices. vol. 60. No. 10. pp. 3442-3449. Oct. 2013 (with online bibliographical data).

International Search Report and Written Opinion issued in International Patent Application No. PCT/JP2015/004547, dated Nov. 17, 2015; with English translation.

Office Action with Search Report issued in Chinese patent application No. 201580049945.5 dated Aug. 15, 2019 with English translation.

* cited by examiner

FIG. 10

| Q0 | Q1 | Q2 | Q3 | CARRY | OUTL | OUT | PHOTON |
|---|---|---|---|---|---|---|---|
| 0 | 0 | 0 | 0 | 0 | 0 | 0 | 0 |
| 1 | 0 | 0 | 0 | 0 | 1 | 0 | 1 |
| 0 | 1 | 0 | 0 | 0 | 2 | 0 | 2 |
| 0 | 0 | 1 | 0 | 0 | 3 | 0 | 3 |
| 0 | 0 | 0 | 1 | 0 | 4 | 0 | 4 |
| 1 | 1 | 0 | 1 | 0 | 11 | 0 | 11 |
| 0 | 0 | 1 | 1 | 0 | 12 | 0 | 12 |
| 1 | 0 | 1 | 1 | 0 | 13 | 0 | 13 |
| 0 | 1 | 1 | 1 | 0 | 14 | 0 | 14 |
| 1 | 1 | 1 | 1 | 0 | 15 | 0 | 15 |
| 0 | 0 | 0 | 0 | 1 | 0 | 1 | 16 |
| 1 | 1 | 1 | 1 | 0 | 15 | 1 | 31 |
| 0 | 0 | 0 | 0 | 1 | 0 | 2 | 32 |
| 1 | 1 | 1 | 1 | 0 | 15 | 2 | 47 |
| 0 | 0 | 0 | 0 | 1 | 0 | 3 | 48 |

SOLID-STATE IMAGING DEVICE

CROSS REFERENCE TO RELATED APPLICATIONS

This application is a U.S. continuation application of PCT International Patent Application Number PCT/JP2015/004547 filed on Sep. 8, 2015, claiming the benefit of priority of Japanese Patent Application Number 2014-191115 filed on Sep. 19, 2014, the entire contents of which are hereby incorporated by reference.

BACKGROUND

Technical Field

The present disclosure relates to a solid-state imaging device, and for example, to a solid-state imaging device that detects weak light.

Description of the Related Art

In recent years, there has been a need for a weak light sensor that accurately measures weak light as minute as a single photon (light quantum) in various fields such as medical care, biotechnology and radiometry. Currently, a photomultiplier tube (PMT) is widely used as the weak light sensor.

It is, however, difficult to increase the number of pixels in a PMT because it is a vacuum tube device and even a small PMT has a size of about 10 mm×10 mm. In addition, in order to perform imaging by using a PMT, it is necessary to perform imaging processing by collecting object information at each point by using a method such as scanning an object in XY plane. For this reason, it is difficult to perform photography in real time. Under the circumstances, there is a strong demand for a solid-state weak light sensor in order to simultaneously implement an increase in the number of pixels in the weak light sensor and an increase in the speed of the weak light sensor.

As a solid-state imaging device that detects weak light, a photon-count type solid-state imaging device has been proposed that counts photons that are incident on a photodiode and transmits the result of counting to the outside of the pixel as a digital value signal (see, for example, Japanese Unexamined Patent Application Publication No. H7-67043). Also, a solid-state imaging device that has a structure in which a load resistor is connected and avalanche photodiodes (so-called Geiger mode APDs) to which a high voltage greater than or equal to a breakdown voltage is applied are arranged in an array has also been proposed (see, for example, Japanese Unexamined Patent Application Publication No. S61-152176).

SUMMARY

However, in a configuration as disclosed in Japanese Unexamined Patent Application Publications Nos. 117-67043 and S61-152176 in which a digital count-type circuit is mounted on a pixel as a counter, the circuit scale of the count circuit increases by at least one bit. If the number of bits is increased in order to obtain a desired tone level, because the number of circuit elements and the number of signal lines corresponding to the number of bits increase proportionally, a problem occurs in that the pixel cell size increases and it is difficult to increase the number of pixels.

On the other hand, in order to solve the problem, a solid-state imaging device has been disclosed in which an analog circuit is mounted on a pixel as a counter (see, for example, 9.8 µm SPAD-based Analogue Single Photon Counting Pixel with Bias Controlled Sensitivity). In the solid-state imaging device disclosed in 9.8 µm SPAD-based Analogue Single Photon Counting Pixel with Bias Controlled Sensitivity, a detector discharges electric charges from a storage that stores an initial voltage each time a photon is incident on a light receiving element.

However, as a matter of fact, the amount of electric charges discharged from the storage varies due to variations in amplitude according to the magnitude of photon energy and variations in parasitic capacitance of a control transistor that controls the discharge from the storage. For this reason, the amount of change ($\Delta V$) in the voltage of the storage is not constant and may vary each time a photon is incident. The number of photons incident on the light receiving element is counted by comparing a reset voltage and the voltage of the storage after the amount of accumulation of $\Delta V$ has been subtracted, but the variations in $\Delta V$ make it difficult to achieve an accurate measurement.

Accordingly, it is an object of the present disclosure to provide a solid-state imaging device that has a high-performance photon count function and that can increase the number of pixels while having a small pixel size.

In order to achieve the object described above, a solid-state imaging device according to one aspect of the present disclosure is a solid-state imaging device, including: a detector including a light receiving element that is an avalanche amplification type light receiving element and that detects a photon, and a resetter that resets an output potential of the light receiving element, the detector outputting a digital signal that indicates presence or absence of incidence of a photon on the light receiving element; a count value storage that performs counting by converting the digital signal output from the detector to an analog voltage, and stores a result of counting as a count value; and a reader that outputs an analog signal indicating the count value.

According to the present disclosure, it is possible to provide a solid-state imaging device that has high-performance photon count function and that can increase the number of pixels while having a small pixel size.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 10 is a diagram showing an example of operation of the solid-state imaging device according to Embodiment 3.

DETAILED DESCRIPTION OF THE EMBODIMENTS

Hereinafter, embodiments according to the present disclosure will be described specifically with reference to the drawings.

Note that the embodiments described below show generic or specific examples of the present disclosure. The numerical values, shapes, materials, structural elements, the arrangement and connection of the structural elements, steps, the order of the steps, and the like shown in the following embodiments are merely examples, and therefore are not intended to limit the scope of the present disclosure. Also, among the structural elements described in the following embodiments, structural elements not recited in any one of the independent claims are described as arbitrary structural elements.

Embodiment 1

Figure 1:
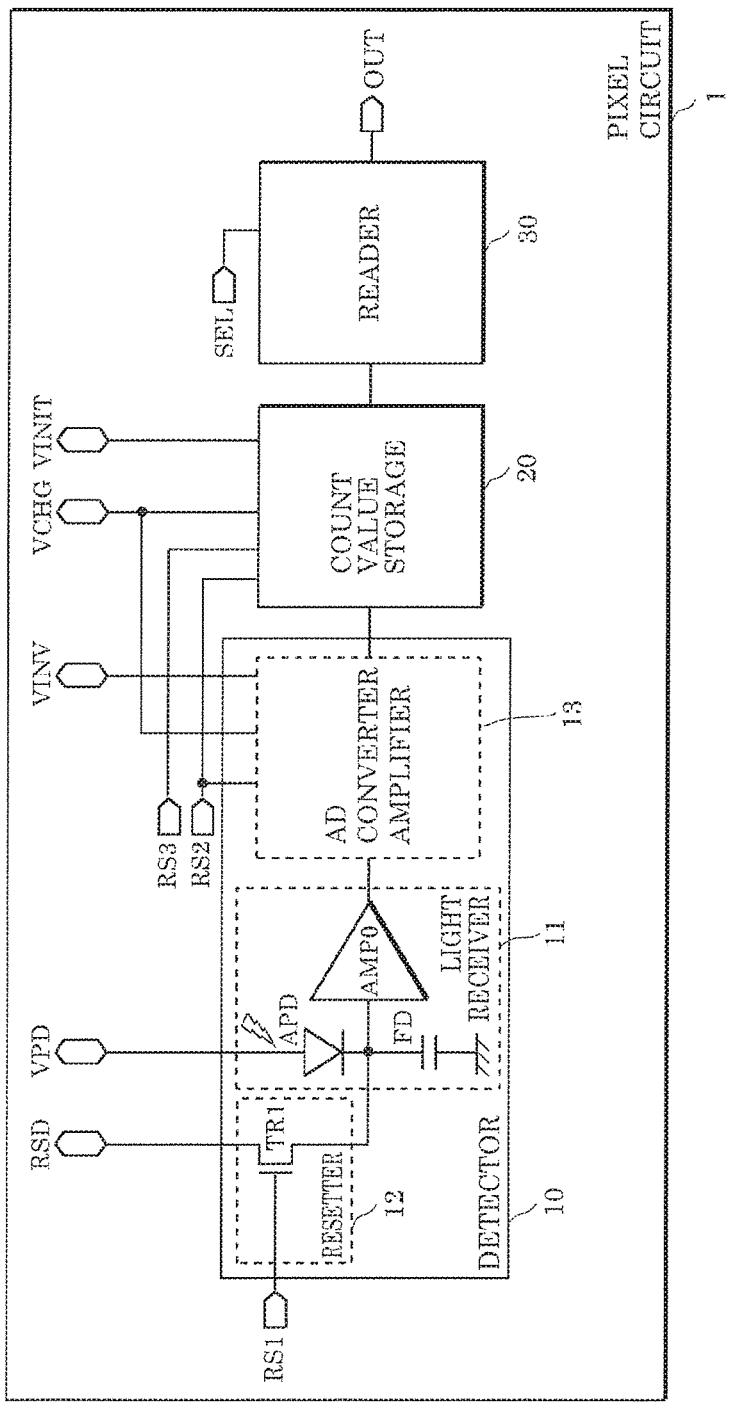
FIG. 1 is a circuit block diagram showing a functional configuration of a unit pixel included in a solid-state imaging device according to Embodiment 1.
Figure 2:
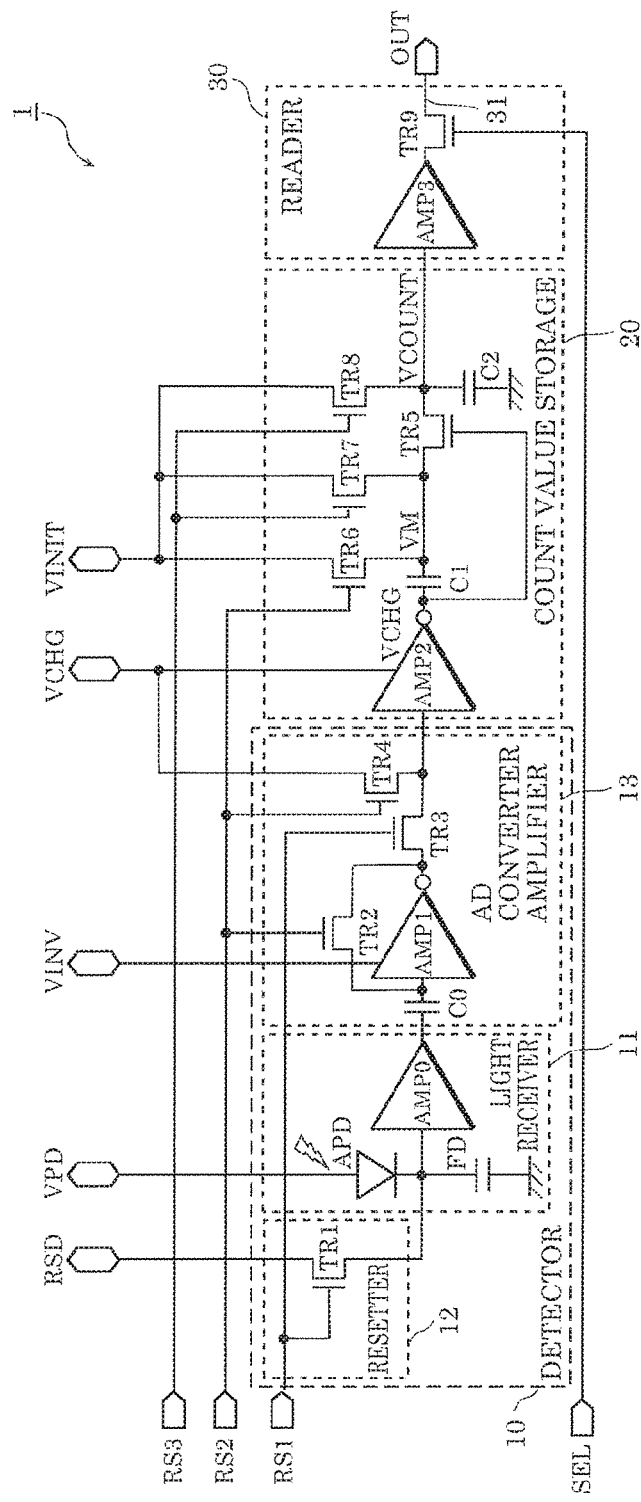
FIG. 2 is a circuit diagram showing an example of a circuit configuration of the unit pixel included in the solid-state imaging device according to Embodiment 1.

First, pixel circuit 1 of a unit pixel included in a solid-state imaging device according to the present embodiment will be described with reference to FIGS. 1 and 2. FIG. 1 is a circuit block diagram showing a functional configuration of a unit pixel included in a solid-state imaging device according to the present embodiment. FIG. 2 is a circuit diagram showing an example of a circuit configuration of the unit pixel included in the solid-state imaging device according to the preset embodiment.

A solid-state imaging device according to the present embodiment includes a plurality of pixels that are arranged in a matrix. Each (unit pixel) of the plurality of pixels includes pixel circuit 1 shown in FIG. 1. As shown in FIG. 1, pixel circuit 1 includes detector 10, count value storage 20 and reader 30.

Detector 10 includes light receiver 11, resetter 12, and AD converter amplifier 13. Detector 10 outputs a digital signal indicating the presence or absence of incidence of a photon on a light receiving element of light receiver 11.

Light receiver 11 includes avalanche amplification type light receiving element APD, floating diffusion FD, and preamplifier AMP0.

Light receiving element APD is an example of a light receiving element for detecting a photon. To be specific, light receiving element APD is an avalanche amplification type photodiode. The anode of light receiving element APD is connected to power supply VPD, and the cathode of light receiving element APD is connected to floating diffusion FD. Light receiving element APD captures incident photons, and generates electric charges by the captured photons. The generated electric charges are accumulated and stored in floating diffusion FD.

Floating diffusion FD is an example of an electric charge accumulator that accumulates electric charges generated by light receiving element APD. The connection point between floating diffusion FD and the cathode of light receiving element APD is connected to the input terminal of preamplifier AMP0 and resetter 12.

Preamplifier AMP0 performs voltage conversion on the electric charges accumulated in floating diffusion FD so as to amplify the electric charges. To be specific, the potential of floating diffusion FD (hereinafter referred to as FD potential) is voltage-converted and amplified. To be specific, FD potential is the potential of the connection point between floating diffusion FD and the cathode of light receiving element APD.

Resetter 12 resets the output potential of light receiving element APD. In the present embodiment, resetter 12 resets the FD potential of floating diffusion FD to an initial state.

To be specific, resetter 12 includes transistor TR1. Transistor TR1 is a switching transistor connected between floating diffusion FD and power supply RSD. The control terminal (for example, gate terminal) of transistor TR1 is connected to terminal RS1, and transistor TR1 is controlled to be conductive or non-conductive by the control signal input from terminal RS1. When transistor TR1 is made conductive, reset voltage Vrsd is applied from power supply RSD to floating diffusion FD, and the FD potential is reset to an initial state. That is, the initial state is a state in which reset voltage Vrsd is applied.

AD converter amplifier 13 converts the output voltage of preamplifier AMP0 to a digital signal so as to amplify the digital signal. In the present embodiment, AD converter amplifier 13 reads the presence or absence of incidence of a photon on light receiving element APD from the output voltage of light receiver 11, and outputs the read result as a digital signal.

To be specific, the digital signal output by AD converter amplifier 13 has a first signal level in which the FD potential remains constant at the initial state and a second signal level in which the FD potential varies due to incidence of a photon on light receiving element APD. For example, the digital signal is a digital binary signal having a high level and a low level.

The digital binary signal is brought to the low level (second signal level) when a photon is incident on light receiving element APD, and is brought to the high level (first signal level) when a photon is not incident on light receiving element APD. To be specific, the digital binary signal is brought to the low level when the FD potential is reset, or in other words, when the FD potential that has dropped by the incidence of a photon rises.

In the present embodiment, as shown in FIG. 2, AD converter amplifier 13 includes DC-cut capacitor C0, inverter AMP1, and transistors TR2 to TR4.

DC-cut capacitor C0 is a capacitor for removing the direct current component of a signal output from light receiver 11. DC-cut capacitor C0 is connected between the output terminal of preamplifier AMP0 and the input terminal of inverter AMP1.

Inverter AMP1 converts the voltage signal generated by preamplifier AMP0 to a digital signal. The input terminal of inverter AMP1 is connected to preamplifier AMP0 via DC-cut capacitor C0, and the output terminal of inverter AMP1 is connected to count value storage 20 (to be specific, inverter AMP2) via transistor TR3. Also, inverter AMP1 is connected to power supply VINV, and receives a supply of voltage Vinv as a power supply voltage.

For example, if the input voltage of inverter AMP1 rises, the output voltage of inverter AMP1 is brought to a low level. The input voltage of inverter AMP1 changes by the output voltage of preamplifier AMP0, and thus changes by the presence or absence of incidence of a photon on light receiving element APD. Accordingly, inverter AMP1 outputs digital signals of different signal levels depending on the presence or absence of incidence of a photon.

Transistor TR2 is a switching transistor for equalizing inverter AMP1, and is connected between the input terminal and the output terminal of inverter AMP1. The control terminal of transistor TR2 is connected to terminal RS2, and transistor TR2 is controlled to be conductive or non-conductive by a control signal input from terminal RS2. When transistor TR2 is made conductive, inverter AMP1 is equalized.

Transistor TR3 is a switching transistor connected between the output terminal of inverter AMP1 and the input terminal of inverter AMP2. The control terminal of transistor TR3 is connected to terminal RS1, and transistor TR3 is controlled to be conductive or non-conductive by a control signal input from terminal RS1. That is, transistor TR3 operates in synchronization with transistor TR1. When transistor TR3 is made conductive, the output voltage of inverter AMP1 is supplied to inverter AMP2.

Transistor TR4 is a switching transistor connected between the input terminal of inverter AMP2 and power supply VCHG. The control terminal of transistor TR4 is connected to terminal RS2, and transistor TR4 is controlled to be conductive or non-conductive by the control signal input from terminal RS2. That is, transistor TR4 operates in synchronization with transistor TR2. When transistor TR4 is made conductive, the input voltage of inverter AMP2 is set to voltage Vchg.

Count value storage 20 performs counting by converting the digital signal output from detector 10 to an analog value, and stores the result of counting as a count value. To be specific, count value storage 20 converts the digital signal output from AD converter amplifier 13 to an analog voltage ($\Delta V$ (n), which will be described later), and performs counting by integrating the analog voltage obtained as a result of conversion.

To be specific, the signal level of the digital signal changes (for example, from a high level to a low level) each time a photon is incident on light receiving element APD. Count value storage 20 counts the number of times of incidence of a photon as an integrated analog value by integrating an analog voltage corresponding to the change. To rephrase it, the integrated value (or in other words, count value) of the analog voltage corresponds to the number of photons incident on light receiving element APD.

In the present embodiment, as shown in FIG. 2, count value storage 20 includes inverter AMP2, capacitors C1 and C2, and transistors TR5 to TR8.

Inverter AMP2 inversely amplifies the digital signal output from inverter AMP1. The input terminal of inverter AMP2 is connected to the output terminal of inverter AMP1 via transistor TR3, and the output terminal of inverter AMP2 is connected to capacitor C1. Also, inverter AMP2 is connected to power supply VCHG, and receives a supply of voltage Vchg as a power supply voltage.

Capacitor C1 and capacitor C2 are connected in series between the output terminal of inverter AMP2 and the ground potential. To be specific, one electrode of capacitor C1 is connected to inverter AMP2, and the other electrode of capacitor C1 is connected to one electrode of capacitor C2 via transistor TR5. The other electrode of capacitor C2 is grounded.

With this configuration, the digital signal output from AD converter amplifier 13 is converted to an analog voltage based on the ratio of capacitance values of capacitor C1 and capacitor C2. To be specific, the output voltage of inverter AMP2 is distributed to one electrode (to be specific, output node VCOUNT) of capacitor C2 by capacitor C1 and capacitor C2. Voltage Vcount (n) of output node VCOUNT corresponds to the count value. Here, n represents the number of times of detection of a photon (the number of incident photons).

Transistor TR5 is a switching transistor connected between capacitor C1 and capacitor C2. The control terminal of transistor TR5 is connected to the output terminal of inverter AMP2, and transistor TR5 is controlled to be conductive or non-conductive by the output voltage of inverter AMP2.

To be specific, when the voltage of the output terminal of inverter AMP2 is brought to a high level, transistor TR5 is made conductive, and capacitor C1 and capacitor C2 are electrically connected in series. When the output voltage of inverter AMP2 is a low level, transistor TR5 is non-conductive, and thus the voltage stored in capacitor C2 does not change. That is, the voltage stored in capacitor C2 changes only when the output voltage of inverter AMP2 is brought to a high level. To be specific, the voltage stored in capacitor C2 changes only when the FD potential that has dropped due to a photon being incident on light receiving element APD is reset, or in other words, only when the input into preamplifier AMP0 rises.

Transistor TR6 is a switching transistor connected between the other electrode (intermediate node VM) of capacitor C1 and power supply VINIT. The control terminal of transistor TR6 is connected to terminal RS2, and transistor TR6 is controlled to be conductive or non-conductive by the control signal input from terminal RS2. That is, transistor TR6 operates in synchronization with transistors TR2 and TR4. When transistor TR6 is made conductive, the voltage of intermediate node VM is set to initial voltage Vinit.

Transistor TR7 is a switching transistor connected between the other electrode (intermediate node VM) of capacitor C1 and power supply VINIT. The control terminal of transistor TR7 is connected to terminal RS3, and transistor TR7 is controlled to be conductive or non-conductive by the control signal input from terminal RS3. When transistor TR7 is made conductive, the voltage of intermediate node VM is set to initial voltage Vinit.

Transistor TR8 is a switching transistor connected between one electrode (output node VCOUNT) of capacitor C2 and power supply VINIT. The control terminal of transistor TR8 is connected to terminal RS3, and transistor TR8 is controlled to be conductive or non-conductive by the control signal input from terminal RS3. That is, transistor TR8 operates in synchronization with transistor TR7. When transistor TR8 is made conductive, the voltage Vcount (n) of output node VCOUNT is set to initial voltage Vinit.

Reader 30 outputs the count value stored in count value storage 20 as an analog signal. In the present embodiment, as shown in FIG. 2, reader 30 includes amplifier AMP3, transistor TR9, and output signal line 31. Reader 30 reads the count value into output signal line 31 as an analog signal at a predetermined timing.

Amplifier AMP3 amplifies voltage Vcount (n) of output node VCOUNT. The input terminal of amplifier AMP3 is connected to output node VCOUNT, and the output terminal of amplifier AMP3 is connected to output signal line 31 and output terminal OUT via transistor TR9.

Transistor TR9 is connected between the output terminal of amplifier AMP3 and output signal line 31. The control terminal of transistor TR9 is connected to terminal SEL, and transistor TR9 is controlled to be conductive or non-conductive by the control signal input from terminal SEL. When transistor TR9 is made conductive, the output voltage of amplifier AMP3 is output to output terminal OUT via output signal line 31.

Figure 3:
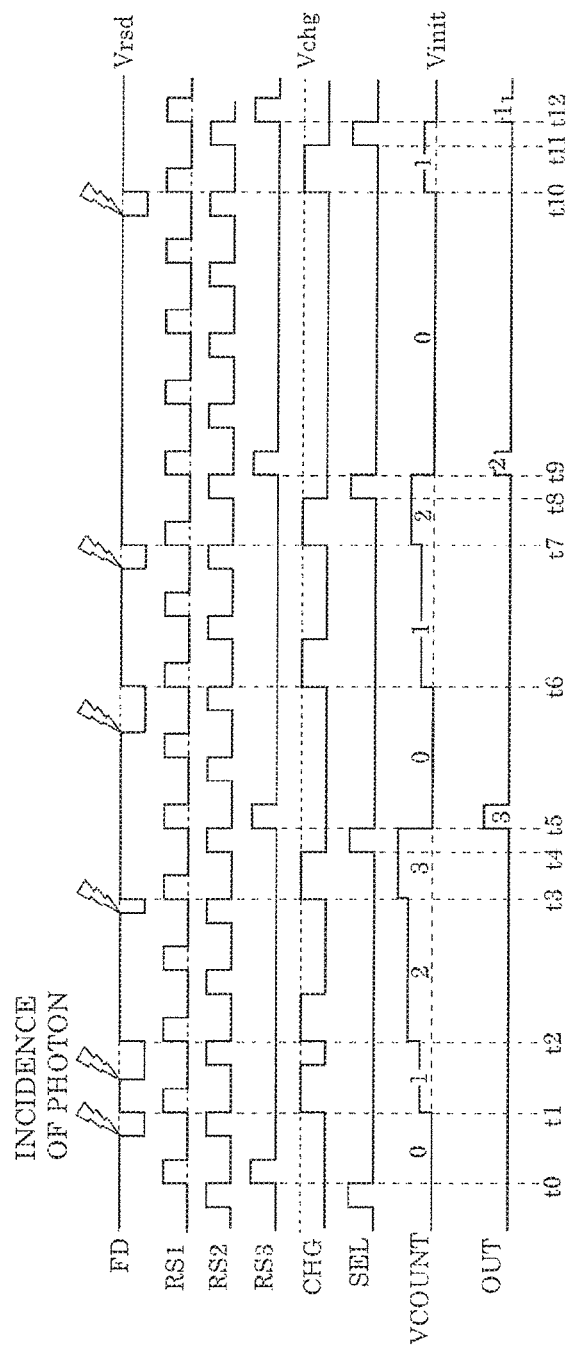
FIG. 3 is a timing chart showing an example of operation of the solid-state imaging device according to Embodiment 1.

Next, the operation of pixel circuit 1 included in the solid-state imaging device according to the present embodiment will be described with reference to FIG. 3. FIG. 3 is a timing chart showing an example of operation of the solid-state imaging device according to the present embodiment.

In FIG. 3, FD represents the FD potential, and RS1, RS2, RS3, and SEL respectively represent the control signals supplied from terminal RS1, terminal RS2, terminal RS3, and terminal SEL. CHG represents the output voltage of inverter AMP2, and VCOUNT represents the voltage of one electrode (output node VCOUNT) of capacitor C2, or in other words, the count value. OUT represents the voltage of output terminal OUT.

At time t0, a pulse (high-level control signal) is applied to terminal RS3 so as to make transistors TR7 and TR8 of count value storage 20 conductive. By doing so, voltage Vcount (n) of output node VCOUNT is set to initial voltage Vinit. The analog voltage corresponding to initial voltage Vinit is taken as count value 0. The FD potential of floating diffusion FD has been reset to an initial state. That is, reset voltage Vrsd has been applied to floating diffusion FD.

After that, upon incidence of a photon on light receiving element APD, the FD potential drops. Floating diffusion FD stores the dropped potential. Preamplifier AMP0 performs voltage conversion on the FD potential, and outputs a voltage signal. At this time, transistor TR2 of AD converter amplifier 13 is made conductive by application of a pulse to terminal RS2. As a result, inverter AMP1 is equalized.

At time t1, a pulse is applied to terminal RS1, and reset voltage Vrsd is applied to floating diffusion FD, as a result of which the FD potential rises by an amount corresponding to the amount of drop caused by the incidence of a photon. The amount of rise of the potential is amplified by preamplifier AMP0, and the input potential of inverter AMP1 rises via DC-cut capacitor C0. Accordingly, the output voltage of inverter AMP1 is brought to a low level. Upon input of the low-level output voltage into inverter AMP2 of count value storage 20 via transistor TR3, inverter AMP2 outputs its power supply voltage, namely, voltage Vchg (high level).

At this time, transistor TR5 is made conductive, and thus output voltage Vchg of inverter AMP2 is charged into output node VCOUNT via transistor TR5 as voltage ΔV (n) represented by the following Equations 1 to 3 by redistribution of electric charges between capacitor C1 and capacitor C2. For example, ΔV (n) corresponds to a count value of 1, the count value being an analog voltage, and the number of incident photons can be counted by integration of ΔV (n).

$$\Delta V(n) = (V\text{chg} - V\text{count}(n-1)) \times C1 \div (C1 + C2) \quad \text{Equation 1}$$

$$V\text{count}(0) = V\text{init} \quad \text{Equation 2}$$

$$V\text{count}(n) = V\text{init} + \Delta V(n) \quad \text{Equation 3}$$

The output amplitude of inverter AMP1 is defined by the equalized voltage and power supply voltage Vinv of inverter AMP1, and thus it is not brought to a full swing between power supply voltage Vinv and the ground level. For this reason, inverter AMP2 is required.

Detector 10 can change the first signal level and the second signal level of the output digital signal. To be specific, detector 10 can change the high level and the low level of the digital signal. To be more specific, power supply voltage Vinv of inverter AMP1 and the ground-side low voltage can be set arbitrarily.

After that, transistor TR4 of AD converter amplifier 13 is made conductive by application of a pulse to terminal RS2. As a result, the output terminal of inverter AMP1 and the input terminal of inverter AMP2 are brought to voltage Vchg, or in other words, a high level. At this time, transistor TR6 is also made conductive, and thus intermediate node VM is initialized to initial voltage Vinit via transistor TR6, and the photon detection state is reset.

Because photons are incident on light receiving element APD during this period, in the driving example shown in FIG. 3, the FD potential is shown as being dropped. Accordingly, the above-described operation is repeated, and at time t2, a pulse is applied to terminal RS1, as a result of which voltage Vcount(2) that is the count value takes a count value of 2, the count value being the analog voltage.

Furthermore, at time t3 that is immediately after next incidence of a photon, voltage Vcount(3) takes a count value of 3, the count value being the analog voltage.

At time t4, the count value of 3 amplified by amplifier AMP3 included in reader 30 is output to terminal OUT by application of a pulse to terminal SEL thereby to make transistor TR9 conductive.

Time t5 is a repetition of time t0 described above, and the period from time t0 to time t5 constitutes one cycle for counting the number of photons. That is, FIG. 3 shows that three photons were detected during one cycle. After that, two photons are detected during the period between time t5 and time t9, and one photon is detected during the period between time t9 and time t12.

In this way, pixel circuit 1 according to the present embodiment can count the number of photons incident on light receiving element APD during a predetermined period. To be specific, count value storage 20 can count, within a predetermined period, the same number of photons as the number of reset pulses that show timings at which resetter 12 resets the FD potential, as the integrated value of the analog voltage. That is, count value storage 20 can count the number of times of resetting of the FD potential, to be specific, the number of photons that is less than or equal to the number of reset pulses supplied to terminal RS1, during a predetermined period.

As described above, the solid-state imaging device according to the present embodiment includes detector 10, count value storage 20, and reader 30, detector 10 including avalanche amplification type light receiving element APD that detects a photon and resetter 12 that resets the output potential of light receiving element APD, and outputting a digital signal indicating the presence or absence of incidence of a photon on light receiving element APD, count value storage 20 converting the digital signal output from detector 10 to an analog voltage and counting the analog voltage and storing the result as a count value, and reader 30 outputting an analog signal indicating the count value.

In this way, detector 10 outputs a digital signal indicating the presence or absence of incidence of a photon on light receiving element APD, and it is therefore possible to alleviate the variation in the amplitude of light receiving element APD at the time when a photon is incident. With this configuration, it is possible to suppress an error per photon and suppress the occurrence of an error between the number of times of incidence of a photon and the count value. Also, count value storage 20 performs counting by converting the digital signal to an analog value, and it is therefore possible to significantly reduce the number of circuit elements constituting count value storage 20 as compared to a conventional digital counting circuit.

Accordingly, with the present embodiment, it is possible to implement a solid-state imaging device that has a high-performance photon count function and that can increase the number of pixels while having a small pixel size.

Also, for example, light receiving element APD is an avalanche amplification type photodiode. Detector 10 further includes: floating diffusion FD that accumulates electric charges generated by the avalanche amplification type photodiode; preamplifier AMP0 that performs voltage conversion on the electric charges accumulated in floating diffusion FD and amplifies the resultant; and AD converter amplifier 13 that converts the output voltage of preamplifier AMP0 to a digital signal. Resetter 12 resets the FD potential to an initial state, and the digital signal has a first signal level in which the FD potential remains constant at the initial state and a second signal level in which the FD potential varies from the initial state due to incidence of a photon on light receiving element APD.

With this configuration, the presence or absence of incidence of a photon on light receiving element APD can be determined by the presence or absence of a variation in the FD potential that has been reset. Accordingly, photon detection can be performed with a simple configuration.

Also, for example, detector 10 may change the first signal level and the second signal level.

With this configuration, the degree of freedom in circuit design can be increased, and for example, a reduction in power consumption and the like can be achieved.

Also, for example, count value storage 20 can count, within a predetermined period, the same number of photons as the number of reset pulses that show timings at which resetter 12 resets the FD potential, as the integrated value of the analog voltage.

With this configuration, the number of detectable photons can be adjusted as appropriate by adjusting the number of reset pulses during a predetermined period.

Also, for example, reader 30 includes output signal line 31, and reads the count value into output signal line 31 as an analog signal at a predetermined timing.

With this configuration, the count value is read as an analog signal, and it is therefore possible to implement reading of the count value by using one output signal line 31 for reading the count value. To rephrase it, it is sufficient that pixel circuit 1 included in the solid-state imaging device according to the present embodiment includes only one output signal line 31 to read the count value.

For example, count value storage 20 may include capacitor C1 and capacitor C2, and convert the digital signal to an analog voltage based on the ratio of capacitance values of capacitor C1 and capacitor C2. At least one of capacitor C1 and capacitor C2 may be a variable capacitor.

As can be seen from Equation 1, in the ratio of capacitance values of capacitor C1 and capacitor C2, $\Delta V(n)$ decreases as capacitance value C1 decreases. Alternatively, $\Delta V(n)$ decreases as capacitance value C2 increases. The amplitude of voltage Vcount (n) needs to be less than or equal to the power supply voltage connected to reader 30, and thus by arbitrarily adjusting the ratio of capacitance values of capacitor C1 and capacitor C2, it is possible to set $\Delta V(n)$ with which a desired number of photons can be counted.

Also, likewise, as can be seen from Equation 1, $\Delta V(n)$ increases as power supply voltage Vchg of inverter AMP2 increases. It becomes easier to read the count value output from count value storage 20 in a later stage as $\Delta V(n)$ increases, and thus it is preferable that voltage Vchg can be set to be as large as possible.

For example, the solid-state imaging device according to the present embodiment may include a voltage controller (not shown) that variably controls the power supply voltage. To be specific, the voltage controller variably controls the voltages supplied by power supply RSD, power supply VPD, power supply VINV, power supply VCHG, and power supply VINIT. For example, the voltage controller is capable of changing reset voltage Vrsd supplied by power supply RSD. Alternatively, the voltage controller may be capable of changing voltage Vinv, voltage Vchg or initial voltage Vinit.

As with transistors TR6, TR7, and TR8 described above, the transistors connected to capacitor C1 and capacitor C2 generate a thermal noise (also called kTC noise) when they function as switches. That is, because the kTC noise is generated in capacitor C1 and capacitor C2 while the transistors are non-conductive, if $\Delta V(n)$ that is the count value of the analog voltage is set to be a small value, the image quality may be deteriorated.

In order to suppress the deterioration of image quality, one or more transistors may be controlled by a control signal in which at least one of the amplitude and the waveform is variable. That is, the solid-state imaging device according to the present embodiment may include a controller (not shown) that generates a control signal that controls one or more transistors and in which at least one of the amplitude and the waveform is variable. To be specific, as with terminals RS2 and RS3 shown in FIG. 2, the control signals that control the transistors connected to the capacitors are arbitrarily changed such as reducing the amplitude value or forming the waveform to have a tapered shape. By doing so, the kTC nose is unlikely to occur.

Here, for example, preamplifier AMP0 may perform inverter operation. In this case, for example, resetter 12 may selectively apply two mutually different reset voltages to floating diffusion FD. By doing so, it is also possible to perform photon detection with more ease.

For example, the presence or absence of incidence of a photon is detected by applying reset voltage Vrsd at time t1 shown in FIG. 3, and thereafter a voltage lower than reset voltage Vrsd is applied to floating diffusion FD so as to make transistor TR1 non-conductive. By doing so, light receiving element APD is brought into an exposed state, with a potential that is lower than reset voltage Vrsd being set in floating diffusion FD.

If, in this state, a photon is incident on light receiving element APD, the output of preamplifier AMP0 is easily inverted even when the energy of the photon energy is weak and the variation of the potential of floating diffusion FD is small. For this reason, even a weak photon can be detected.

Embodiment 2

Next, a solid-state imaging device according to Embodiment 2 will be described.

Figure 4:
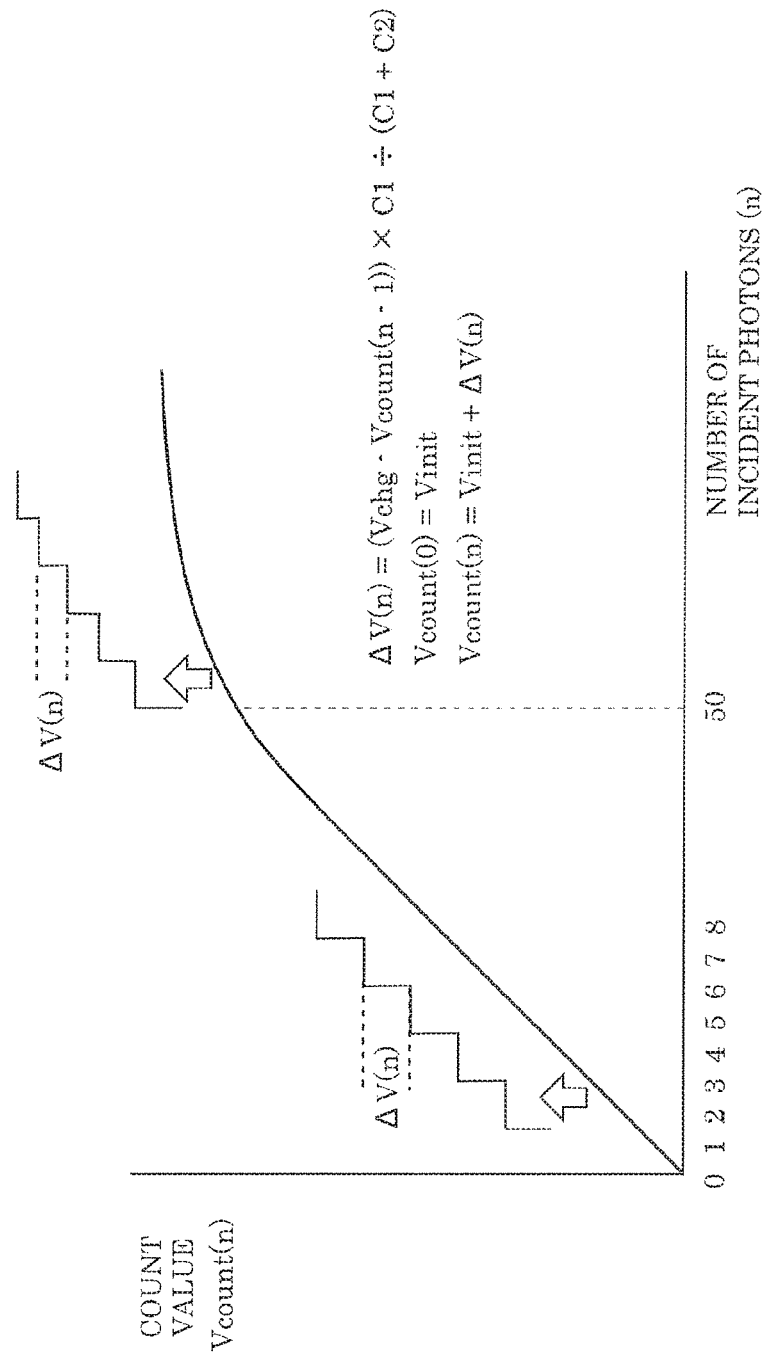
FIG. 4 is a diagram showing correspondence between the number of photons incident on a light receiving element and the count value in the solid-state imaging device according to Embodiment 1.

In the photon detection operation described in Embodiment 1, if the number of photons that are incident on light receiving element APD increases, as shown in FIG. 4, voltage Vcount (n) that is the count value may not increase linearly. FIG. 4 is a diagram showing correspondence between the number of photons incident on light receiving element APD and the count value in the solid-state imaging device according to Embodiment 1.

As can be seen from Equations 1 to 3 given above, if the difference between output voltage Vchg of inverter AMP2 and count value Vcount (n−1) decreases, ΔV (n) that is the analog voltage gradually decreases. In the end, when voltage Vcount (n−1) is equal to voltage Vchg, ΔV (n) reaches 0, and integration stops. The count value (the number of integrations) can be increased by setting initial voltage Vinit to a low voltage or by increasing capacitor C2, but in this case, it becomes difficult to read ΔV (n) in a later stage because ΔV (n) decreases.

To address this, in the solid-state imaging device according to the present embodiment, the count value is stored by being divided into a high-order digit and a low-order digit. The low-order digit of the count value is, for example, a numerical value corresponding to one or more least significant bits when the count value is represented by a digital value. The high-order digit of the count value is, for example, a numerical value corresponding to one or more most significant bits when the count value is represented by a digital value. For example, where the count value is represented by a digital value of n bits, the low-order digit can be a numerical value corresponding to m bits from the least significant bit, and the high-order digit can be a numerical value corresponding to n-m bits from the most significant bit.

Hereinafter, the pixel circuit of a unit pixel included in the solid-state imaging device according to the present embodiment will be descried with reference to FIGS. 5 and 6.

Figure 5:
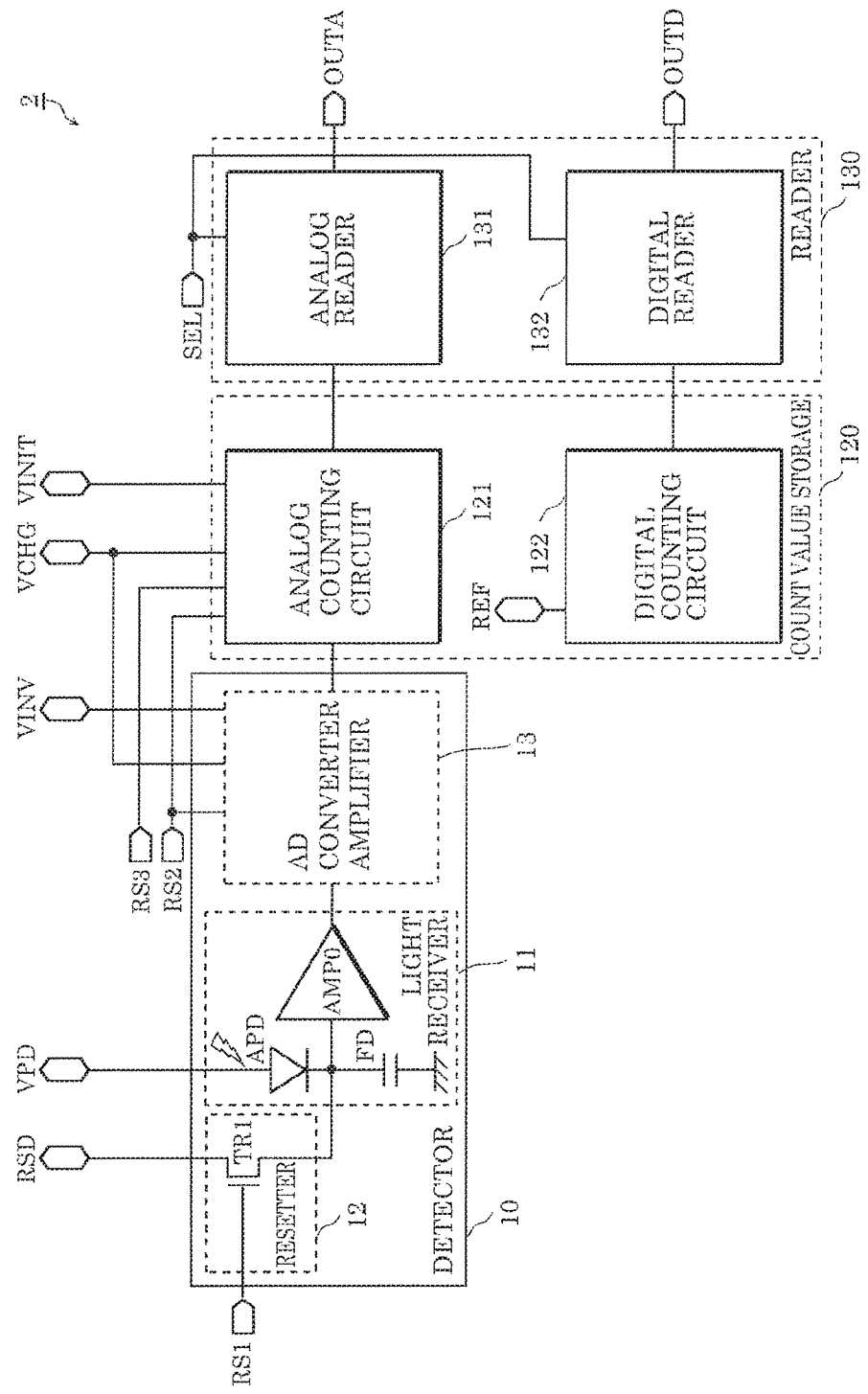
FIG. 5 is a circuit block diagram showing a functional configuration of a unit pixel included in a solid-state imaging device according to Embodiment 2.
Figure 6:
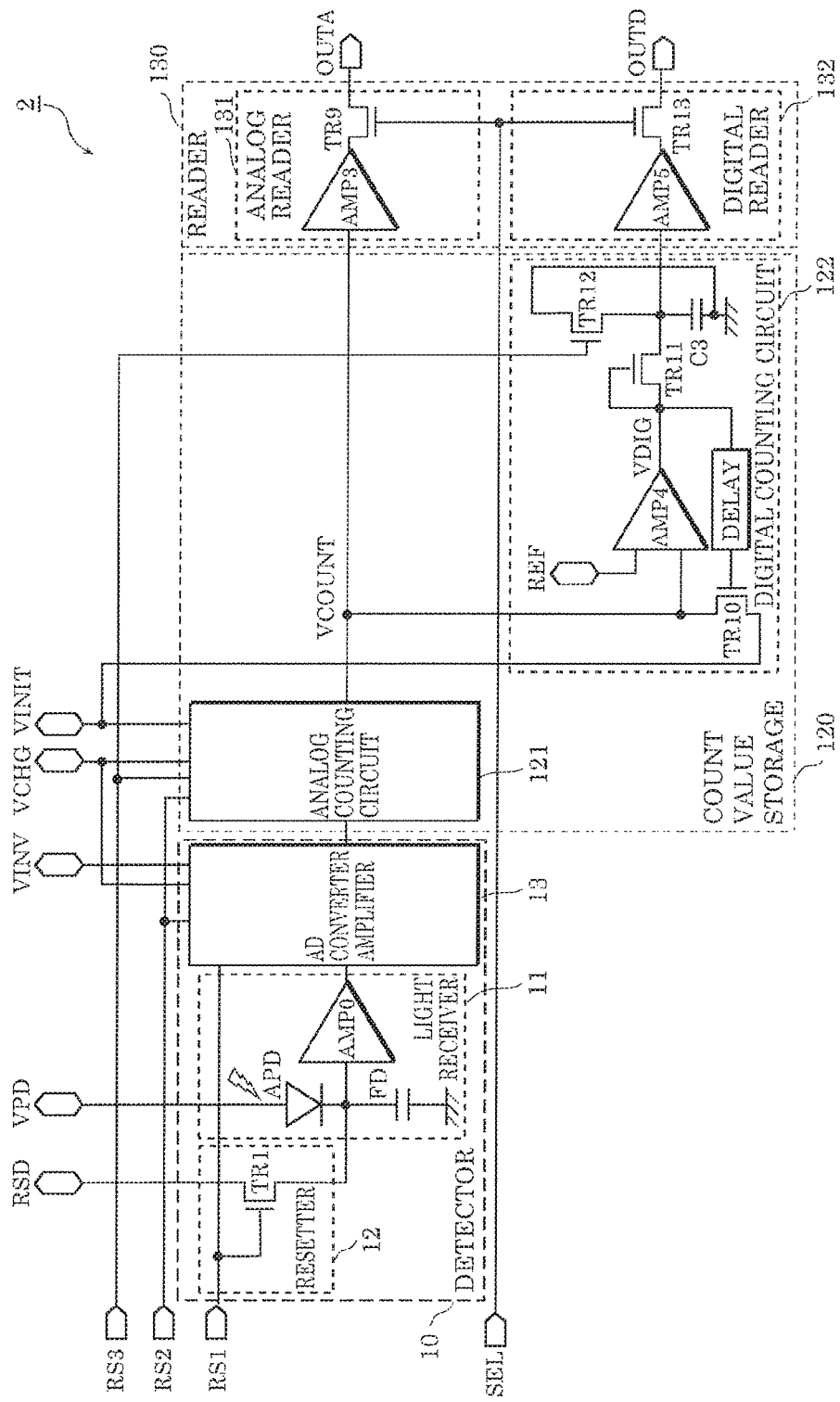
FIG. 6 is a circuit diagram showing an example of a circuit configuration of the unit pixel included in the solid-state imaging device according to Embodiment 2.

FIG. 5 is a circuit block diagram showing a functional configuration of a unit pixel included in the solid-state imaging device according to the present embodiment. FIG. 6 is a circuit diagram showing an example of a circuit configuration of the unit pixel included in the solid-state imaging device according to the present embodiment.

As shown in FIG. 5, pixel circuit 2 according to the present embodiment is different from pixel circuit 1 shown in FIG. 1 in that pixel circuit 2 includes count value storage 120 and reader 130, in place of count value storage 20 and reader 30.

Count value storage 120 includes analog counting circuit 121 and digital counting circuit 122.

Analog counting circuit 121 stores the low-order digit of the count value as an analog value. In the present embodiment, analog counting circuit 121 includes a plurality of capacitors, and converts the digital signal output from detector 10 to an analog voltage based on the ratio of capacitance values of the plurality of capacitors and stores the analog voltage. To be specific, analog counting circuit 121 has the same circuit configuration as that of count value storage 20 shown in FIG. 2.

Digital counting circuit 122 stores the high-order digit of the count value as a digital value. In the present embodiment, as shown in FIG. 6, digital counting circuit 122 includes comparator AMP4, transistors TR10 to TR12, delay circuit DELAY, and capacitor C3.

Comparator AMP4 compares voltage Vcount (n) of output node VCOUNT and reference voltage Vref, and outputs the result of comparison. Two input terminals of comparator AMP4 are connected to output node VCOUNT of analog counting circuit 121 and power supply REF for supplying reference voltage Vref, respectively. The output terminal (node VDIG) of comparator AMP4 is connected to reader 130 (to be specific, digital reader 132) via transistor TR11.

For example, comparator AMP4 outputs a high-level signal if voltage Vcount (n) is greater than reference voltage Vref.

Transistor TR10 is a switching transistor connected between output node VCOUNT and power supply VINIT. The control terminal of transistor TR10 is connected to the output terminal (node VDIG) of comparator AMP4 via delay circuit DELAY. Accordingly, transistor TR10 is made conductive after elapse of a delay period from the time when comparator AMP4 outputs a high-level signal. When transistor TR10 is made conductive, output node VCOUNT is set to initial voltage Vinit. That is, voltage Vcount (n) of output node VCOUNT, or in other words, the count value is reset to initial voltage Vinit if it exceeds reference voltage Vref.

Transistor TR11 is a switching transistor connected between comparator AMP4 and amplifier AMP5 of digital reader 132. The control terminal of transistor TR11 is connected to the output terminal of comparator AMP4. Accordingly, transistor TR11 is made conductive when comparator AMP4 outputs a high-level signal, and the high-level signal is input into amplifier AMP5.

Transistor TR12 is a switching transistor electrically connected in parallel to capacitor C3. The control terminal of transistor TR12 is connected to terminal RS3, and transistor TR12 is controlled to be conductive or non-conductive by a control signal input from terminal RS3. That is, transistor TR12 operates in synchronization with transistors TR7 and TR8. When transistor TR12 is made conductive, the voltage stored in capacitor C3 is reset.

Capacitor C3 is a capacitor for storing the high-order digit of the count value. One electrode of capacitor C3 is connected to the output terminal of comparator AMP4 via transistor TR11, and the other electrode of capacitor C3 is grounded. Accordingly, when comparator AMP4 outputs a high-level signal, capacitor C3 stores the voltage value.

In this way, at the time when voltage Vcount (n) that is the count value exceeds predetermined reference voltage Vref, count value storage 120 performs counting by incrementing to the high-order bit and setting voltage Vcount (n) back to initial voltage Vinit.

As shown in FIG. 5, reader 130 includes analog reader 131 and digital reader 132.

Analog reader 131 outputs the low-order digit of the count value stored in analog counting circuit 121 as an analog signal. In the present embodiment, analog reader 131 has the same circuit configuration as that of reader 30 shown in FIG. 2.

Digital reader 132 outputs the high-order digit of the count value stored in digital counting circuit 122 as a digital signal. In the present embodiment, digital reader 132 includes amplifier AMP5 and transistor TR13, as with reader 30 shown in FIG. 2. Amplifier AMP5 and transistor TR13 respectively correspond to amplifier AMP3 and transistor TR9, and perform the same operations.

Figure 7:
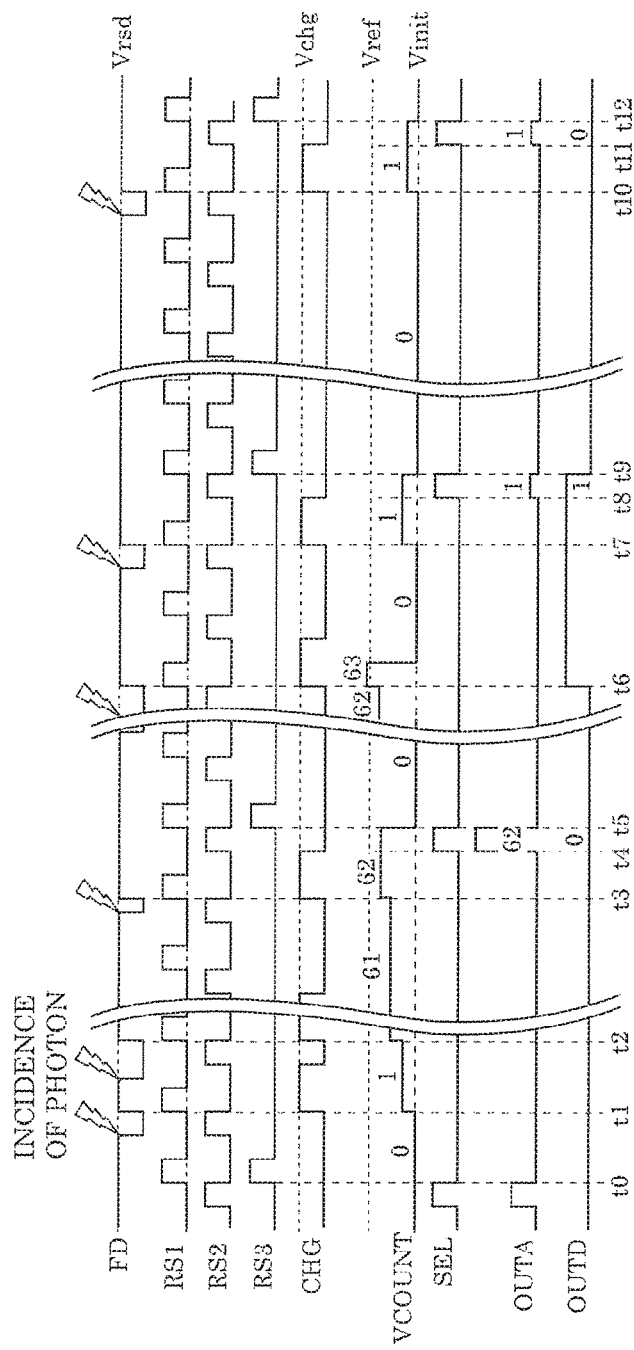
FIG. 7 is a timing chart showing an example of operation of the solid-state imaging device according to Embodiment 2.

Next, the operation of pixel circuit 2 included in the solid-state imaging device according to the present embodiment will be described with reference to FIG. 7. FIG. 7 is a timing chart showing an example of operation of the solid-state imaging device according to the present embodiment. The driving example shown in FIG. 7 is different from the driving example shown in FIG. 3 in that the bit is incremented when the number of times of incidence of a photon exceeds 63.

In power supply REF, reference voltage Vref corresponding to a count value of 63 (voltage Vcount (n)=63) is set.

At time t6 when voltage Vcount (n) exceeds reference voltage Vref, comparator AMP4 outputs a high-level signal.

In response thereto, transistor TR11 is made conductive, and the voltage is stored in capacitor C3. To rephrase it, one bit corresponding to a count value of 63 is stored in capacitor C3.

After that, transistor TR10 is made conductive by delay circuit DELAY after elapse of a delay period so as to reset voltage Vcount (n) to initial voltage Vinit. After that, if a photon is detected, at time t7, count value storage 120 increases the count from 0 to 1.

At time t8, the analog count value representing the low-order digit (to be specific, 1) is read from OUTA, and the digital value representing the high-order digit (to be specific, 63) is read from OUTD. At time t9 the count value is completely cleared. By adding the analog value representing the low-order digit and the digital value representing the high-order digit, the number of photons that are incident within a predetermined period can be counted accurately.

As described above, in the solid-state imaging device according to the present embodiment, for example, count value storage 120 includes analog counting circuit 121 that stores the low-order digit of the count value as an analog value and digital counting circuit 122 that stores the high-order digit of the count value as a digital value.

With this configuration, even if there are a large number of incident photons, because the count value is stored by being divided into a high-order digit and a low-order digit, the number of photons can be accurately counted. For example, voltage Vcount (n) can be reset before the number of photons and the count value shown in FIG. 4 deviate significantly from a linear relationship, and thus the number of photons can be accurately counted by using ΔV (n).

Also, for example, reader 130 reads the low-order digit of the count value as an analog value and reads the high-order digit of the count value as a digital value.

Accordingly, even if there are a large number of incident photons, the count value is read after it is divided into a high-order digit and a low-order digit, and thus the number of photons can be accurately counted.

Embodiment 3

Next, a solid-state imaging device according to Embodiment 3 will be described.

In the solid-state imaging device according to the present embodiment, as in Embodiment 2, the count value is stored by being divided into a high-order digit and a low-order digit. Embodiment 2 has showed an example in which the high-order digit of the count value is stored as a digital value, and the low-order digit of the count value is stored as an analog value, but in the present embodiment, the low-order digit of the count value is stored as a digital value, and the high-order digit of the count value is stored as an analog value.

Figure 8:
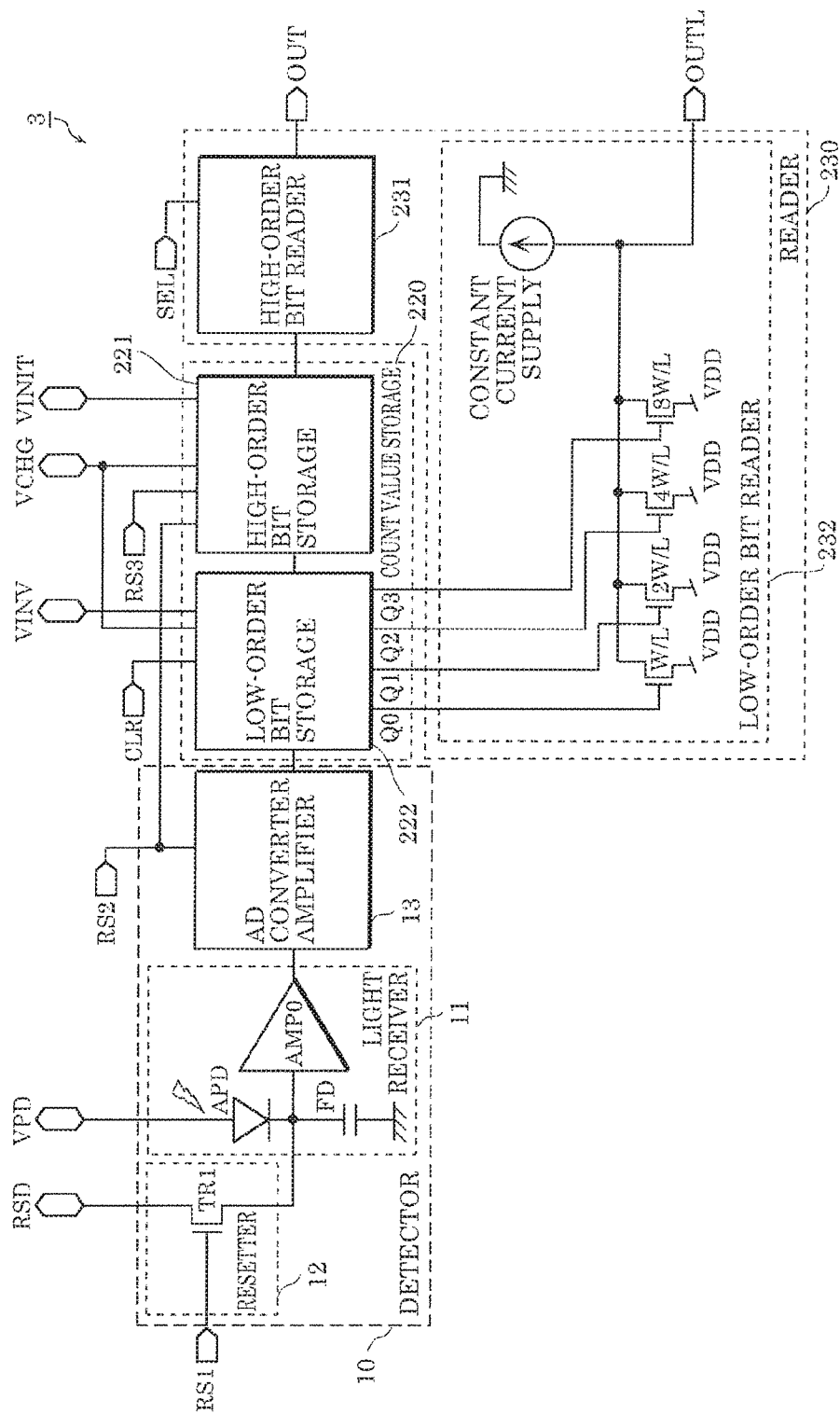
FIG. 8 is a circuit block diagram showing a functional configuration of a unit pixel included in a solid-state imaging device according to Embodiment 3.
Figure 9:
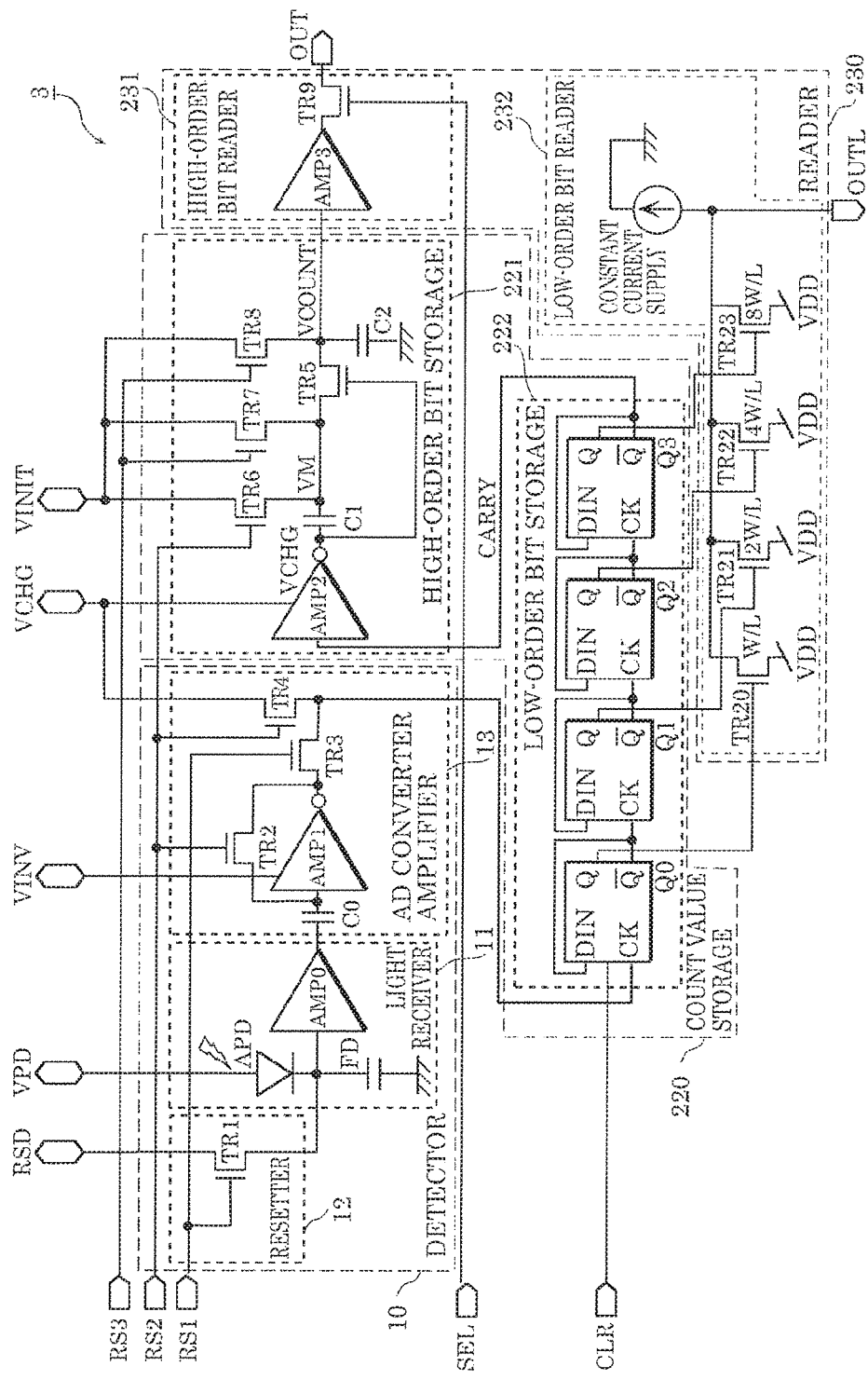
FIG. 9 is a circuit diagram showing an example of a circuit configuration of the unit pixel included in the solid-state imaging device according to Embodiment 3.

Hereinafter, first, a pixel circuit of a unit pixel included in the solid-state imaging device according to the present embodiment will be described with reference to FIGS. 8 and 9. FIG. 8 is a circuit block diagram showing a functional configuration of a unit pixel included in the solid-state imaging device according to the present embodiment. FIG. 9 is a circuit diagram showing an example of a circuit configuration of the unit pixel included in the solid-state imaging device according to the present embodiment.

As shown in FIG. 8, pixel circuit 3 according to the present embodiment is different from pixel circuit 1 shown in FIG. 1 in that pixel circuit 3 includes count value storage 220 and reader 230 in place of count value storage 20 and reader 30.

Count value storage 220 includes high-order bit storage 221 and low-order bit storage 222.

High-order bit storage 221 is an example of an analog counting circuit that stores the high-order digit of the count value as an analog value. In the present embodiment, high-order bit storage 221 has the same circuit configuration as that of count value storage 20 shown in FIG. 2. High-order bit storage 221 receives an input from the output terminal of low-order bit storage 222, rather than the output terminal of AD converter amplifier 13.

Low-order bit storage 222 is an example of a digital counting circuit that stores the low-order digit of the count value as a digital value. In the present embodiment, as shown in FIG. 9, low-order bit storage 222 includes a 4-bit (16 tone level) counter having four D-type flip-flops Q0 to Q3. D-type flip-flop Q0 stores the least significant bit of the 4-bit count value, and D-type flip-flop Q3 stores the most significant bit of the 4-bit count value.

Clock terminal CK of each of the four D-type flip-flops Q0 to Q3 is connected to output terminal-Q (meaning the negation of Q) of the preceding flip-flop, and input terminal D of the same is connected to output terminal-Q of the same. Clock terminal CK of foremost D-type flip-flop Q0 is connected to the output terminal of AD converter amplifier 13. Output terminal-Q of last D-type flip-flop Q3 is connected to the input terminal of high-order bit storage 221 (to be specific, inverter AMP2). Also, output terminals Q of D-type flip-flops Q0 to Q3 are respectively connected to the control terminals of transistors TR20 to TR23 included in low-order bit reader 232.

Reader 230 divides the count value into a low-order digit and a high-order digit, and reads them as analog values. In the present embodiment, as shown in FIG. 8, reader 230 includes high-order bit reader 231 and low-order bit reader 232.

High-order bit reader 231 outputs the high-order digit of the count value stored in high-order bit storage 221 as an analog signal. In the present embodiment, high-order bit reader 231 has the same circuit configuration as that of reader 30 shown in FIG. 2.

Low-order bit reader 232 outputs the low-order digit of the count value stored in low-order bit storage 222 as an analog signal. In the present embodiment, as shown in FIG. 9, low-order bit reader 232 includes transistors TR20 to TR23 and a constant current supply.

Transistors TR20 to TR23 are switching transistors connected between power supply VDD and the constant current supply/output terminal OUTL. Transistors TR20 to TR23 are electrically connected in parallel to each other. The control terminals of transistors TR20 to TR23 are respectively connected to output terminals Q of D-type flip-flops Q0 to Q3.

To be specific, transistor TR20 is made conductive when output terminal Q of D-type flip-flop Q0 is brought to a high level. Transistor TR21 is made conductive when output terminal Q of D-type flip-flop Q1 is brought to a high level. Transistor TR22 is made conductive when output terminal Q of D-type flip-flop Q2 is brought to a high level. Transistor TR23 is made conductive when output terminal Q of D-type flip-flop Q3 is brought to a high level.

Transistors TR20 to TR23 have mutually different channel width W-to-channel length L ratio (W/L). To be specific, where the channel width-to-channel length ratio of transistor TR20 is represented by W/L, the ratios of transistors TR21 to TR23 are represented by 2W/L, 4W/L, and 8W/L, respectively.

When any one of transistors TR20 to TR23 is made conductive, the output voltage of the transistor that has been made conductive is output to output terminal OUTL. Accordingly, as a result of transistors TR20 to TR23 being combined and made conductive, an analog voltage corresponding to the low-order digit stored in low-order bit storage 222 can be output to output terminal OUTL.

To be specific, in response to a digital signal (low level) output from AD converter amplifier 13, the 4-bit counter circuit included in low-order bit storage 222 starts a count operation. For example, when output Q of D-type flip-flop Q0 storing the least significant bit is 1, transistor TR20 is made conductive, and a predetermined voltage is generated in output terminal OUTL by transistor TR20 and the constant current supply. This voltage is set as a count value of 1.

After that, each time a photon is incident to input a low level digital signal, the outputs of D-type flip-flops Q1, Q2, and Q3 change, and the voltage of output terminal OUTL changes accordingly. After that, when the 4-bit counter circuit reaches a full count, CARRY signal is brought to a high level and input into high-order bit storage 221.

After that, the high-order bit is counted by high-order bit storage 221. As a result, as shown in FIG. 10, the output of output terminal OUT of the high-order digit and the output of output terminal OUTL of the low-order digit are changed according to the number of detected photons. FIG. 10 is a diagram showing an example of operation of the solid-state imaging device according to the present embodiment.

As described above, in the solid-state imaging device according to the present embodiment, for example, count value storage 220 includes low-order bit storage 222 that stores the low-order digit of the count value as a digital value and high-order bit storage 221 that stores the high-order digit of the count value as an analog value.

With this configuration, even if there are a large number of incident photons, because the count value is stored by being divided into a high-order digit and a low-order digit, the number of photons can be accurately counted. For example, voltage Vcount (n) can be reset before the number of photons and the count value shown in FIG. 4 deviate significantly from a linear relationship, and thus the number of photons can be accurately counted by using ΔV (n).

Also, for example, reader 230 divides the count value into a low-order digit and a high-order digit and reads them as analog values.

With this configuration, even if there are a large number of incident photons, because the count value is read by being divided into a high-order digit and a low-order digit, the number of photons can be accurately counted.

Variations

Embodiments 1 to 3 have been described above assuming that the device is operated in an environment where the number of incident photons is limited, but in the case where a number of photons that cause the count value stored in the count value storage to overflow are incident such as in the general environment, avalanche amplification type light receiving element APD according to the present disclosure may be operated as a normal photodiode that is a non-avalanche amplification type photodiode.

Figure 11:
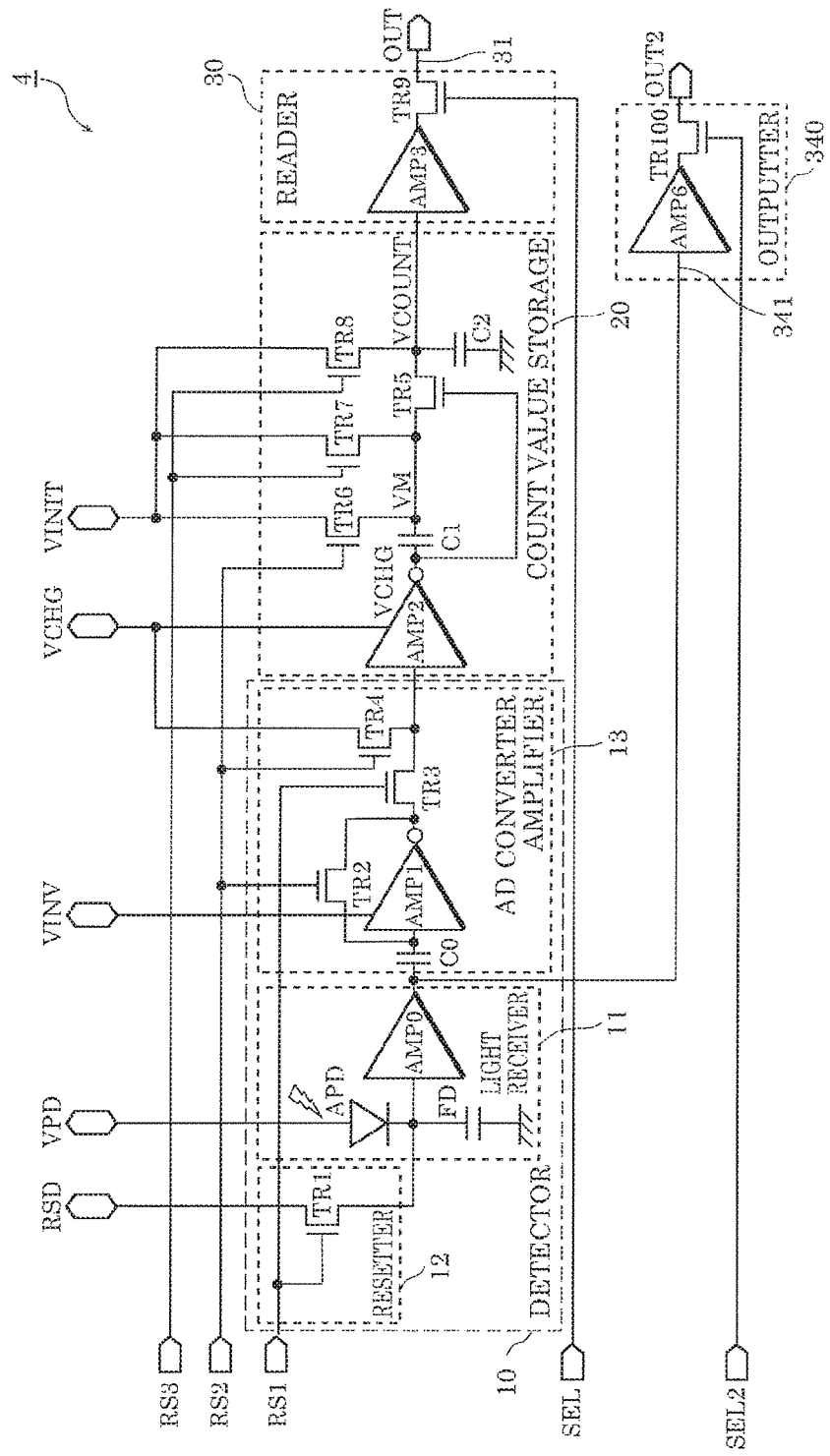
FIG. 11 is a circuit diagram showing an example of a circuit configuration of a unit pixel included in a solid-state imaging device according to a variation of an embodiment.

FIG. 11 is a circuit diagram showing an example of a circuit configuration of a unit pixel included in a solid-state imaging device according to the present variation.

Pixel circuit 4 shown in FIG. 11 is different from pixel circuit 1 shown in FIG. 2 in that pixel circuit 4 further includes outputter 340.

Outputter 340 outputs the output voltage of preamplifier AMP0 without converting the output voltage of preamplifier AMP0 to a digital signal when light receiving element APD operates as a non-avalanche amplification type light receiving element. In the present embodiment, outputter 340 includes signal line 341, amplifier AMP6, and transistor TR100. Amplifier AMP6 and transistor TR100 respectively correspond to amplifier AMP3 and transistor TR9 included in reader 30. The control terminal of transistor TR is connected to terminal SEL2, and reading can be performed at a timing different from that of reader 30.

Signal line 341 connects the output terminal of preamplifier AMP0 and the input terminal of amplifier AMP6. Accordingly, the output voltage of preamplifier AMP0 is output from preamplifier AMP0 to output terminal OUT2 without passing through AD converter amplifier 13 and count value storage 20.

As described above, in the solid-state imaging device according to the present variation, for example, if a number of photons that cause the count value to overflow are incident, light receiving element APD operates as a non-avalanche amplification type light receiving element.

With this configuration, it is possible to, for example, capture photons and provide an output regardless of the environment of use, and thus photography can be performed in a wide dynamic range from detection of weak light to daily environment.

Also, for example, light receiving element APD may include a color filter or a microlens.

With this configuration, it is possible to provide color images and achieve an even higher sensitivity.

Other Embodiments

The solid-state imaging device according to the present disclosure has been described by way of embodiments, but the present disclosure is not limited to the embodiments given above. The technique according to the present disclosure is applicable to other embodiments implemented by any combination of the structural elements of the embodiments given above, variations obtained by making various modifications that can be conceived by a person having ordinary skill in the art to the embodiments given above without departing from the scope of the present disclosure, and is also applicable as various types of devices and various types of systems incorporating the solid-state imaging device according to the present disclosure.

For example, the embodiments given above have shown an example in which the count value is divided into two, namely, a high-order digit and a low-order digit, but the count value may be read by being divided into three or more.

Also, for example, the embodiments given above have shown an example in which an avalanche amplification type photodiode is used as the avalanche amplification type light receiving element, but it is also possible to use an avalanche amplification type phototransistor.

Also, for example, the embodiments given above have shown an example in which floating diffusion FD is used as the electric charge accumulator, but the present disclosure is not limited thereto as long as a capacitor that accumulates electric charges generated by the light receiving element is used.

Also, the solid-state imaging device according to the present disclosure may have a structure in which pixels are formed on the surface of a semiconductor substrate, or in other words, pixels are formed on the same surface as that on which the gate terminal of a transistor and interconnection are formed. Alternatively, the solid-state imaging device according to the present disclosure may have a structure, so-called backside illuminated image sensor (backside illuminated solid-state imaging device) in which pixels are formed on the backside surface of a semiconductor substrate, or in other words, pixels are formed on the back side of the surface on which the gate terminal of a transistor and interconnection are formed.

Also, various modifications, replacements, additions, omissions and the like can be made to the embodiments given above within the scope of the claims or the range of equivalency.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The solid-state imaging device according to the present disclosure is applicable to, for example, an imaging device or the like that detects weak light in a random luminescent event such as radiation detection.

What is claimed is:

1. A solid-state imaging device, comprising:
  a detector including a light receiving element that is an avalanche amplification type light receiving element and that detects a photon, and a resetter that resets an output potential of the light receiving element, the detector outputting a digital signal that indicates presence or absence of incidence of a photon on the light receiving element;
  a count value storage that performs counting by converting the digital signal output from the detector to an analog voltage, and stores a result of counting as a count value; and
  a reader that outputs an analog signal indicating the count value,
  wherein the light receiving element is an avalanche amplification type photodiode,
  the detector further includes:
    an electric charge accumulator that accumulates electric charges generated by the avalanche amplification type photodiode;
    a preamplifier that performs voltage conversion on the electric charges accumulated in the electric charge accumulator and amplifies the electric charges; and
    an AD converter that converts an output voltage of the preamplifier to the digital signal,
  the resetter resets a potential of the electric charge accumulator to an initial state, and
  the digital signal has: a first signal level in which the potential of the electric charge accumulator remains constant at the initial state; and a second signal level in which the potential of the electric charge accumulator varies from the initial state due to incidence of a photon on the light receiving element.

2. The solid-state imaging device according to claim 1, wherein the resetter selectively applies two mutually different reset voltages to the electric charge accumulator.

3. The solid-state imaging device according to claim 1, wherein the preamplifier performs inverter operation.

4. The solid-state imaging device according to claim 1, wherein the detector is capable of changing the first signal level and the second signal level.

5. The solid-state imaging device according to claim 1, wherein the count value storage includes a plurality of capacitors, and converts the digital signal to the analog voltage based on a ratio of capacitance values of the plurality of capacitors, and
at least one of the plurality of capacitors is a variable capacitor.

6. The solid-state imaging device according to claim 1, wherein the count value storage includes one or more transistors and a plurality of capacitors connected to the one or more transistors, and converts the digital signal to the analog voltage based on a ratio of capacitance values of the plurality of capacitors, and
the one or more transistors are controlled by a control signal in which at least one of amplitude and waveform is variable.

7. The solid-state imaging device according to claim 1, wherein the count value storage is capable of counting, within a predetermined period, the same number of photons as the number of reset pulses that show timings at which the resetter resets the output potential of the light receiving element, as an integrated value of the analog voltage.

8. The solid-state imaging device according to claim 1, wherein the light receiving element operates as a non-avalanche amplification type light receiving element when a number of photons that cause the count value to overflow are incident.

9. The solid-state imaging device according to claim 8, wherein the solid-state imaging device further includes an outputter that outputs the output voltage of the preamplifier without converting the output voltage of the preamplifier to the digital signal when the light receiving element operates as a non-avalanche amplification type light receiving element.

10. The solid-state imaging device according to claim 8, wherein the light receiving element includes a color filter or a microlens.

11. The solid-state imaging device according to claim 1, wherein the reader includes an output signal line, and reads the count value into the output signal line as the analog signal at a predetermined timing.

12. The solid-state imaging device according to claim 1, wherein the count value storage includes:
  an analog counting circuit that stores a low-order digit of the count value as an analog value; and
  a digital counting circuit that stores a high-order digit of the count value as a digital value.

13. The solid-state imaging device according to claim 12, wherein the reader reads the low-order digit of the count value as the analog value and reads the high-order digit of the count value as the digital value.

14. The solid-state imaging device according to claim 1, the count value storage includes:
  a digital counting circuit that stores a low-order digit of the count value as a digital value; and
  an analog counting circuit that stores a high-order digit of the count value as an analog value.

15. The solid-state imaging device according to claim 1, wherein the reader divides the count value into a low-order digit and a high-order digit, and reads the low-order digit and the high-order digit as analog values.

* * * * *